United States Patent [19]

Strauts et al.

[11] 4,123,797
[45] Oct. 31, 1978

[54] FLYING SPOT PATTERN STORAGE SYSTEM

[75] Inventors: Eric J. Strauts, Park Ridge; John J. Flaherty, Elk Grove Village, both of Ill.

[73] Assignee: Magnaflux Corporation, Chicago, Ill.

[21] Appl. No.: 773,338

[22] Filed: Mar. 1, 1977

[51] Int. Cl.² ............................................. G11C 11/26
[52] U.S. Cl. ...................................... 365/118; 365/217
[58] Field of Search ..................... 340/173 R, 173 CR; 328/123, 124

[56] References Cited

U.S. PATENT DOCUMENTS 3,624,633  11/1971  Hofstein ...................... 340/173 CR Primary Examiner—Terrell W. Fears
Attorney, Agent, or Firm—Brezina & Lund

[57] ABSTRACT

A storage system is provided in which digital numbers are read into a memory by periodically sampling a pair of analog input signals and in which the memory is scanned in timed relation to the signal sampling and also in timed relation to the scanning of a cathode ray tube screen in a raster pattern, the scanning spot being brightened when a stored digital number is detected.

A pair of digital-to-analog converters are used both in sampling and for raster scanning. In sampling, the outputs thereof are compared with the input signals to control analog-to-digital logic circuits and the inputs thereof are connected through multiplexers to the output of the analog-to-digital logic circuits which operate as successive approximation registers. In raster scanning, the inputs of the digital-to-analog converters are connected to counter sections driven from a high frequency clock one being operative to develop a sawtooth signal to generate a sweep line and the other being operative at a field or frame rate. The memory is also connected through the multiplexers, alternately to the outputs of the analog-to-digital logic circuits and to the counters to be scanned in synchronism with the scanning of the screen. The multiplexers are so switched that sampling is performed between successive sweep lines.

7 Claims, 3 Drawing Figures

FLYING SPOT PATTERN STORAGE SYSTEM

This invention relates to a flying spot pattern storage system and more particularly to a system with which a pattern is stored for presentation indefinitely on the screen of a cathode ray tube. The system is highly accurate and reliable in operation and is usable with standard types of cathode ray tubes and is otherwise economically manufacturable.

BACKGROUND OF THE INVENTION

In many types of testing operations and particularly in non-destructive testing, test results are indicated by the pattern of movement of the flying spot of a cathode ray tube. For example, in eddy current testing systems of types known in the art, an eddy current probe is moved over the surface of a part while DC output signals are developed in proportion to quadrature phase components of a signal derived from the probe. Such DC signals are applied to the horizontal and vertical inputs of a cathode ray tube display section to cause a spot to be in a corresponding position. From the pattern of movement of the spot as the probe moves over the part, the characteristics of the part and the nature of defects therein can be accurately ascertained. It is frequently desirable to be able to store the pattern for more careful analysis thereof, photographing and the like. Heretofore, cathode ray tubes have been used in which long persistance phosphors are incorporated in the screens thereof to store patterns for long periods of time. Such tubes have been generally satisfactory but have had disadvantages, particularly in that they are quite expensive and have a limited life. Frequently, the storage of patterns is uneven and lines produced are ragged with fuzzy edges. Also, the time in which signals may be stored is not unlimited.

Oscilloscopes are available in which signals may be stored digitally, but such are not suitable for testing systems in which a pattern is to be produced from a pair of analog signals, the oscilloscopes being operable with a time base versus vertical amplifier signal format.

SUMMARY OF THE INVENTION

This invention was evolved with the general object of overcoming the disadvantages of prior systems and of providing a more economical and accurate and reliable system for storing signal patterns on cathode ray tubes, especially for non-destructive testing operations or the like.

In accordance with this invention, a pair of analog input signals such as developed from an eddy current testing system are periodically sampled to develop digital numbers which are read into a memory. A sampling is performed in timed relation to scanning of the memory and also in timed relation to the scanning of a cathode ray tube screen in a raster pattern and when the scanning spot is at a position corresponding to a number stored in the memory, a spot is brightened. Thus during a complete scan of the memory, a record of changes in the input signals is produced as a pattern on the cathode ray tube screen.

In accordance with specific features of the invention, the sampling and register and memory scanning operations are performed with time-sharing at a rapid rate to simulate a cathode ray storage tube presentation and to obtain other advantageous results. One important feature is in the use of a pair of digital-to-analog converters for both in sampling and for raster scanning. The outputs of such converters are compared with input signals to control analog-to-digital logic circuits while inputs are connected through multiplexers to the output of such logic circuits which operate as successive approximation registers. The inputs of the digital-to-analog converters are connected to counter section driven from a high frequency clock, one being operative to develop a sawtooth signal to produce a sweep line and the other being operative at a field or frame rate.

The memory is also connected through the multiplexers, alternately to the outputs of the logic circuits, for read-in of information, and to the counters, for the scanning operation.

This invention contemplates other objects, features and advantages which will become more fully apparent from the following detailed description taken in conjunction with the accompanying drawings.

DESCRIPTION OF A PREFERRED EMBODIMENT

Figure 1:
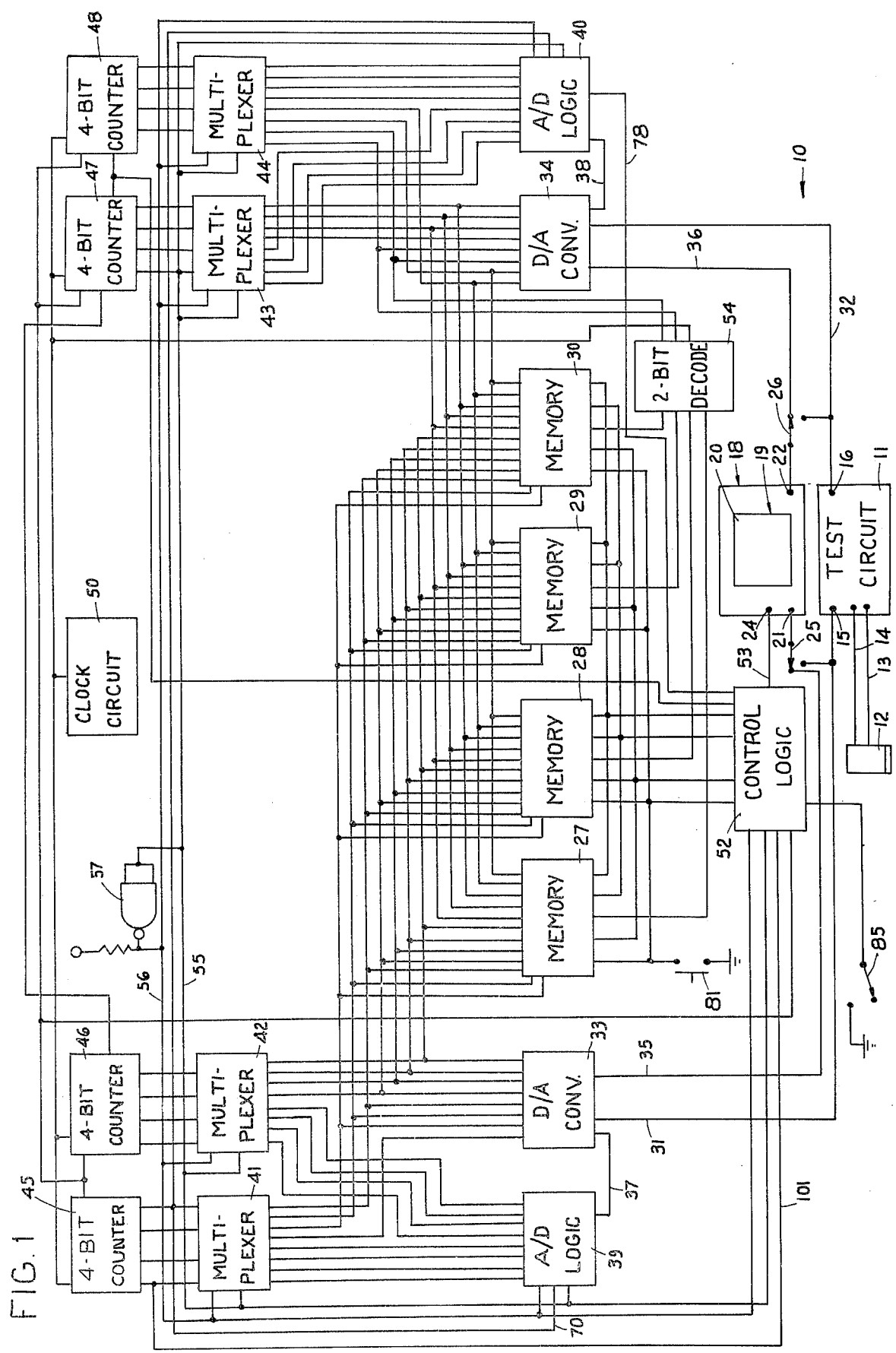
FIG. 1 is a schematic diagram of a system incorporating a flying spot pattern storage arrangement in accorance with the invention.

Reference numeral 10 generally designates a testing system which incorporates a display section and a storage system in accordance with the principles of the invention.

In the system 10 as diagrammatically illustrated a test circuit 11 is provided which is connected to an eddy current probe 12 through conductors 13 and 14 and which has output terminals 15 and 16. Test circuit 11 is preferably of a type known in the art which develops DC signals at the output terminals 15 and 16 corresponding to quadrature phase components of a signal derived from the eddy current probe 12. A display section 18 is provided including, as diagrammatically illustrated, a cathode ray tube 19 having a screen 20 and also including vertical and horizontal deflection circuits having input terminals 21 and 22, and a spot intensity control circuit having an input terminal 24. Input terminals 21 and 22 may be connected through switch contacts 25 and 26 to the output terminals 15 and 16 of the test circuit 11.

When, for example, the probe 12 is moved over a part, cracks in the part will cause changes in amplitude of one or both of the DC signals produced at the output terminals 15 and 16 and the spot will move to a corresponding new position. In many test operations, the path traversed by the spot is important in analyzing the characteristics of the part and in some cases, especially in automatic testing operations, at least a temporary recording of the pattern of movement of the spot is highly desirable.

In accordance with the invention, a signal storage system is provided for recording the signals produced and thereby the path of movement of the spot and for displaying the history of movement of the spot during a testing operation.

The signal storage system includes a random access memory array including four integrated circuits 27–30 each of which may have a 4096 bit capacity so that together 16,384 bit capacity is provided. Input voltages, such as voltages from the output terminals 15 and 16 of the test circuit 11, are periodically sampled and converted to digital numbers which are stored as locations in the memory. In a synchronized operation, sweep signals are applied to terminals 21 and 22 of the display section 18 to develop a raster scan of the screen 20.

When the position of the spot corresponds to a digital number stored in the memory, a signal is applied to terminal 24 of the display section 18 to brighten the spot. The sampling of the input signals, the conversion thereof to digital numbers and the storage thereof in the memory are preferably performed in synchronism with the raster scanning and a time-sharing mode of operation, preferably with there being alternately line scan and sampling operations.

The output terminals 15 and 16 of the test circuit 11 are connected through lines 31 and 32 to control inputs of a pair of digital-to-analog converter circuits 33 and 34 having outputs connected through lines 35 and 36 and through the switch contacts 25 and 26 (in the positions illustrated) to deflection input terminals 21 and 22 of the display section 18. Additional outputs of the converter circuits 33 and 34 are connected through lines 37 and 38 to analog-to-digital logic circuits 39 and 40. Each of the converter circuits 33 and 34 has eight inputs, divided into two groups of four each, the two groups of inputs of converter 33 being connected to multiplexers 41 and 42 and the two groups of inputs of converter circuit 34 being connected to another pair of multiplexers 43 and 44.

Inputs of the multiplexers 41 and 42 are connected to eight output terminals of the analog-to-digital logic circuit 39 while inputs of the multiplexers 43 and 44 are connected to output terminals of the analog-to-digital logic circuit 40. Additional inputs of the multiplexers 41 and 42 are connected to outputs of a pair of four-bit counter circuits 45 and 46 together forming an eight-line counter while additional inputs of multiplexers 43 and 44 are similarly connected to counters 47 and 48. A clock circuit 50 supplies signals to the counter circuits 45–48. A control logic circuit 52 is connected to the memory and other circuits of the system and is also connected through a line 53 to the Z axis or spot intensity input terminal 24 of the display section 18.

It is noted that seven of the eight output terminals of the multiplexers 41 and 42 are connected to terminals of the memory circuits 27–30 which are connected in parallel while five of the eight output terminals of the multiplexers 43 and 44 are connected to terminals of the memory circuits 27–30 with an additional two of such terminals being connected to a two-bit binary decoder 54 having output terminals connected to chip select input terminals of the memory circuits 27–30. The memory is in effect tied to the seven most significant bits of the inputs to each of digital-to-analog converters 33 and 34, having a bit capacity of 16,384 (2 to the 14th power).

The clock circuit 50 supplies a high frequency signal, at 2 MHz, for example, applied to the clock inputs of the four binary counters 45–48 which are cascaded to provide the equivalent of a 16 bit counter. As indicated above, the first eight bits, from counters 45 and 46 are connected to the multiplexers 41 and 42 the other inputs to which are connected to the logic circuit 39. As also indicated above, the outputs of the multiplexers 41 and 42 go to two places, first to the converter circuit 33 and secondly to the memory circuits 27–30. The multiplexers 41 and 42 are switched from one source to the other by complementary voltage levels on a pair of lines 55 and 56, line 55 being connected to one output of the counter circuit 47 and being connected to the line 56 through a gate circuit 57 operated as an inverter.

The signal applied to line 55 from the counter 47 is such that the switching of the multiplexers 41–44 occurs after every complete eight bit sequence from the counters 45 and 46, which is after 128 clock pulses from the clock circuit 50. A complete sequence, wherein the multiplexers switch from one condition to the other and then back again occurs after 256 high frequency clock pulses from the clock circuit 50. When the multiplexers 41–44 are switched to one condition, a sampling operation is performed wherein the amplitudes of the input signals on lines 31 and 32 are compared with the outputs of converter circuits 33 and 34 to control the logic circuits 39 and 40 and to develop at the output of logic circuits 39 and 40 digital conversions of the amplitudes of the applied analog input signals. As hereinafter described, the circuits 39 and 40 operate as successive approximation registers in performing the conversion operation. After the conversion operation is completed, a signal is applied to write the digital number into the memory circuits 27–30.

When the multiplexers 41–44 are switched to the other condition thereof, the converter circuits 33 and 34 operate to develop the signals required for the raster scanning operation. Converter circuit 33 develops an output signal which increases in 128 steps, can effect a sawtooth signal, applied through line 35 to the vertical input terminal 21 of the display section 18 to develop one vertical sweep line. The other converter circuit 34 applies an output signal through line 36 to the horizontal input terminal 22 which increases through one step in response to each switching operation of the multiplexers 41–44 and ultimately a sawtooth wave is developed. After 65,536 clock pules, 128 sawtooths waves are produced on line 35 while one sawtooth wave is produced on line 36. This combination of sawtooth waves produces a raster scan which is repeated at approximately 30 scans per second, when the applied clock signal is at 2 MHz.

Figure 2:
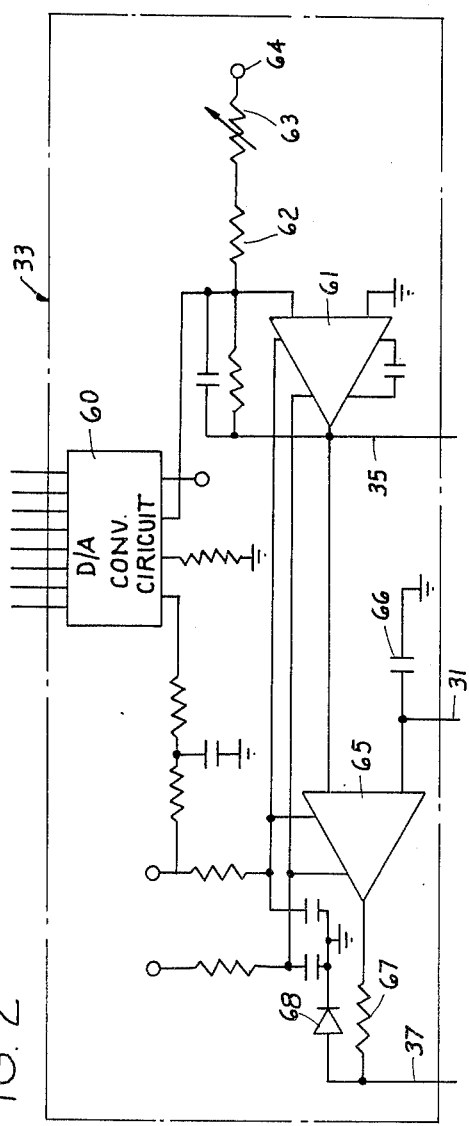
FIG. 2 is a schematic diagram of a digital-to-analog converter circuit of the system of FIG. 1.

Referring to FIG. 2, the converter circuit 33 includes an integrated circuit 60 having input lines connected to the multiplexers 41 and 42 and having an output line connected to one input of an operational amplifier 61, and also through a fixed resistor 62 and an adjustable resistor 63 to a voltage supply terminal 64, the resistor 63 being adjustable to adjust offset. The output of the operational amplifier 61 is connected through the line 35 to the vertical deflection input terminal 21 of the display section 18 and is also connected to one input of a second operational amplifier 65, a second input of the amplifier 65 being connected through a capacitor 66 to ground and directly to the line 31 which is connected to the output terminal 15 of the test circuit 11.

The output of the amplifier 65 is connected through a resistor 67 to the line 37 which is connected through a diode 68 to ground. Line 37 is connected to the analog-to-digital logic circuit 39.

The logic circuit 39 operates as a successive approximation register and in conjunction with the digital-to-analog converter circuit 60 and the associated circuitry of FIG. 2, an analog-to-digital converter is provided, converting an input signal on line 31 into an eight-bit binary number which is proportional in value to the voltage. In response to a clock derived through a line 70 from the counter 45, which is 16 times slower than the main clock, the output of the circuit 39 is changed one bit per clock pulse to cause the output to approximate the input. The most significant bit is changed first and then if it is wrong it is changed back. Then the next bit is tested and so forth until after eight such clock pulses, the correct value is obtained.

Figure 3:
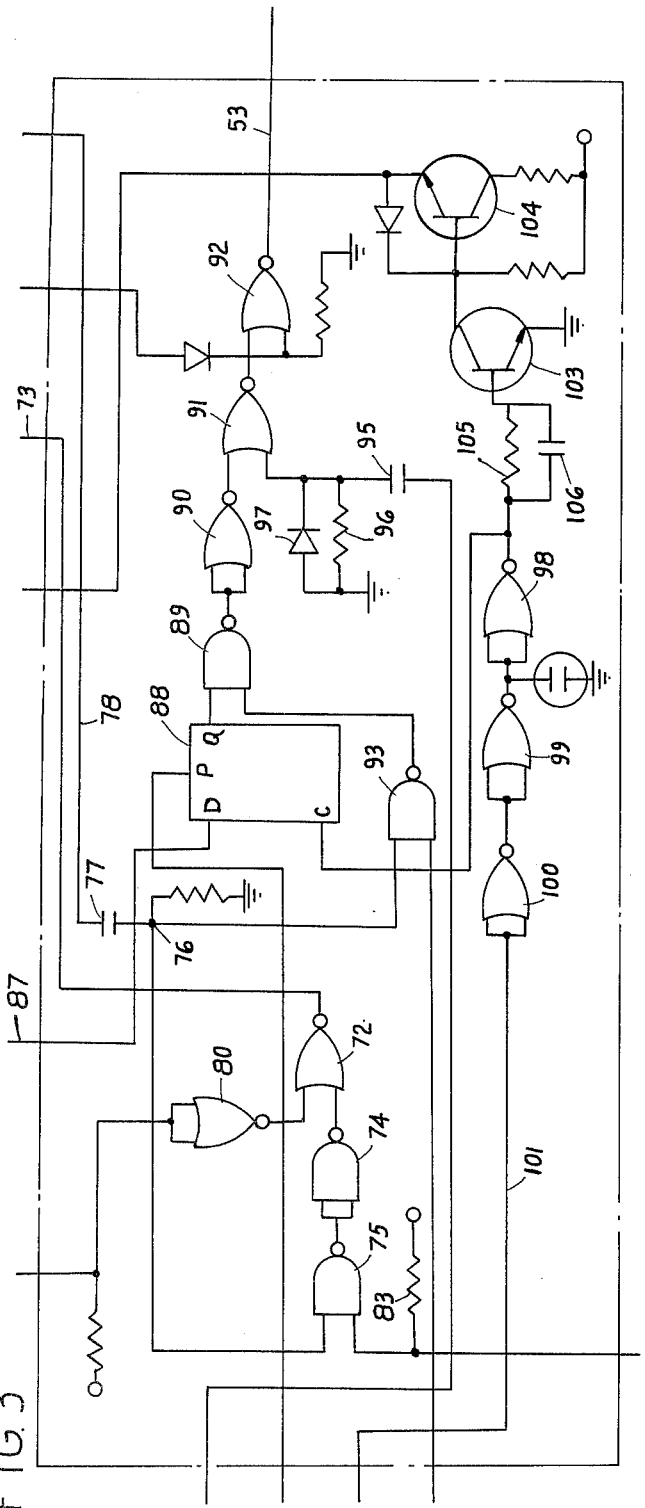
FIG. 3 is a schematic diagram of control logic circuitry of the system of FIG. 1.

Referring to FIG. 3, the control logic circuitry 52 includes a gate circuit 72 having its output connected through a line 73 to write input terminals of the four memory circuits 27-30. One input of the gate circuit 52 is connected through a gate circuit 74, operative as an inverter, to the output of another gate circuit 75. One input of gate circuit 75 is connected to a circuit point 76 which is connected through a capacitor 77 and a line 88 to the logic circuit 40. When the successive approximation conversion operations as above described are completed by all of the circuits 33, 39 and 34, 40, a signal is developed on the line 78 applied through capacitors 77 and gate circuits 75, 74 and 72 and line 73 to cause the digital signals developed at the outputs of the logic circuits 39 and 40 to be written into the memory circuits 27-30 as digital numbers.

A second input of the gate circuit 72 is connected through a gate circuit 80 operative as an inverter, to data input terminals of the four counter circuits 27-30, and also through a push-button switch 81 to ground, as shown in FIG. 1. The push-button switch 81 is an erase switch. When closed, zeroes are written into the memory circuits and after a complete scanning sequence, the entire memory is erased.

A second input of the gate circuit 75 is connected through a resistor 83 to a positive power supply terminal 84 and is also connected to a switch contact 85 which is normally disconnected from ground, as illustrated, but which may be connected to ground. When connected to ground, it is not possible to write information into the memories and the grounded position is a non-store position. When disconnected from ground, the normal storing operation may take place.

When during scanning of the memory circuits, a stored number is detected, a signal is applied through a line 87 to a flip-flop 88 having an output connected through a series of gate circuits 89, 90, 91 and 92 to the output line 53 which is connected to the Z axis or intensity control input terminal of the display section 18. Gate circuit 89 has a second input connected to the output of a gate circuit 93 which has one input connected to the circuit point 76. When the conversion complete signal is applied, as above described, a signal is applied from gate circuit 93 and through the gate circuit 89-92 to intensify the spot and thus register or display the current information obtained from the two input signals 15 and 16.

A network including a capacitor 95, a resistor 96 and a diode 97 is provided for blanking the cathode ray tube during the switchover from the analog-to-digital conversion operation to the raster and memory scan operation.

A control signal is applied to the flip-flop 88 from the output of a gate circuit 98 having an input connected through a pair of gate circuits 99 and 100 to a line 101 which is connected to an output of the counter-circuit 45. The memory requires a high level clock signal because it is a dynamic memory and such is provided from a high speed inverter including transistors 103 and 104. The base of transistor 103 is connected through a resistor 105 and a capacitor 106 and parallel to the output of the gate circuit 98, and capacitor 106 serves as a speed up capacitor. It is noted that the signal derived from counter 45 through line 101 is the source of the memory clock which is the main clock divided by two because only half as many bits can be stored as are converted by the clock. The gate circuits 98-100 operate in providing a delay network so as to allow the address bits to stabilize before a read or write operation is initiated.

It will be understood that modifications and variations may be effected without departing from the spirit and scope of the novel concepts of this invention.

We claim as our invention:

1. In a signal storage system for a display section including a cathode ray tube having a screen and including a pair of deflection signal inputs and a spot intensity control input, raster scan means for applying a low frequency sawtooth field sweep signal and a higher frequency sawtooth line sweep signal to said pair of deflection signal inputs and for causing a spot to traverse said screen in a certain raster pattern, digital memory means, memory scanning means for scanning said memory means in synchronism with said scanning of said screen and in a numerical order having a certain relationship to said raster pattern, a pair of analog signal input circuits, sampling and writing means for periodically sampling the amplitudes of signals applied to said inputs and for writing a corresponding number into said memory means, means operative during scanning of said memory means for developing an output signal in response to detection of each number stored therein, and means for applying said output signal to said spot intensity control input of said display section.

2. In a system as defined in claim 1, means for operating said sampling and writing means in synchronism with said scanning of said screen and said scanning of said memory means.

3. In a system as defined in claim 2, said sampling and writing means being operative in synchronism with said higher frequency sawtooth line sweep signal and during time intervals between successive portions thereof.

4. In a system as defined in claim 1, said memory scanning means including a clock circuit for supplying clock pulses at a certain frequency, and counter means operated from said clock pulses and arranged to apply signals to said memory means to scan the contents of said memory means in response to application of a certain number of said clock pulses thereto.

5. In a system as defined in claim 4, said raster scanning means comprising first and second digital-to-analog converter circuits coupled to different portions of said counter means and arranged to develop said low frequency sawtooth field sweep signal and said higher frequency sawtooth line sweep signal.

6. In a system as defined in claim 4, said sampling and writing means comprising first and second analog-to-digital converter means for converting analog signals at said pair of input circuits to digital signals, first and second multiplexer means operated from said clock circuit at a sub-multiple of said clock frequency and arranged to alternately apply signals from said analog-to-digital converter circuit means and signals from said counter means to said memory.

7. In a system as defined in claim 6, said analog-to-digital converter means including logic circuits operative as successive approximation registers, and digital-to-analog converter circuits operative in conjunction with said analog-to-digital converter means.

* * * * *